United States Patent
Antonini et al.

(10) Patent No.: US 10,678,970 B2
(45) Date of Patent: Jun. 9, 2020

(54) METHOD OF EXPLOITATION OF HYDROCARBONS OF AN UNDERGROUND FORMATION BY MEANS OF OPTIMIZED SCALING

(71) Applicants: IFP Energies nouvelles, Rueil-Malmaison (FR); Centre National de la Recherche Scientifique, Paris (FR); UNIVERSITE DE NICE, Nice (FR)

(72) Inventors: Marc Antonini, Nice (FR); Frédéric Payan, Antibes (FR); Sebastien Schneider, Ste Colombe (FR); Laurent Duval, Nanterre (FI); Jean-Luc Peyrot, Lyons (FR)

(73) Assignees: IFP ENERGIES NOUVELLES, Rueil-Malmaison (FR); CENTRE NATIONAL DE LA RECHERCHE SCIENTIFIQUE, Paris (FR); UNIVERSITE DE NICE, Nice (FR)

(*) Notice: Subject to any disclaimer, the term of this patent is extended or adjusted under 35 U.S.C. 154(b) by 203 days.

(21) Appl. No.: 15/609,902

(22) Filed: May 31, 2017

(65) Prior Publication Data
US 2017/0344676 A1    Nov. 30, 2017

(30) Foreign Application Priority Data
May 31, 2016   (FR) ...................... 16 54906

(51) Int. Cl.
G06G 7/50 (2006.01)
G06F 30/20 (2020.01)
(Continued)

(52) U.S. Cl.
CPC .......... *G06F 30/20* (2020.01); *E21B 41/0092* (2013.01); *G01V 99/005* (2013.01)

(58) Field of Classification Search
CPC ............ G06F 17/5009; E21B 41/0092; G01V 99/005
(Continued)

(56) References Cited

U.S. PATENT DOCUMENTS

2012/0221302 A1* 8/2012 Lewandowski ........ G01V 11/00 703/2
2012/0296616 A1* 11/2012 Tsunoda .............. G06F 17/5018 703/9

(Continued)

OTHER PUBLICATIONS

Cooke et al. (Adaptive mesh refinement of gas-liquid flow on an inclined plane, (10 pages)). (Year: 2013).*
(Continued)

*Primary Examiner* — Andre Pierre Louis
(74) *Attorney, Agent, or Firm* — Fitch, Even, Tabin & Flannery LLP (57) ABSTRACT

The invention is a method for exploitation of a sedimentary basin containing hydrocarbons, including optimized scaling of the geological model. Based on categorical property measurements, a first meshed representation of a formation is constructed reflecting the categorical property measurements. At least one second meshed representation having a lower resolution is constructed by assigning a categorical property value to each mesh of the second representation corresponding to a group of meshes of the first representation and storing parameters for changing from the second representation to the first representation with those change parameters enabling reconstitution of the first representation.

14 Claims, 1 Drawing Sheet

(51) Int. Cl.
*E21B 41/00* (2006.01)
*G01V 99/00* (2009.01)

(58) Field of Classification Search
USPC .................................................. 703/9, 10
See application file for complete search history.

(56) References Cited

U.S. PATENT DOCUMENTS

2013/0346049 A1* 12/2013 Le Ravalec .......... G01V 99/005
                                                      703/10
2016/0292320 A1* 10/2016 Palkowsky ........... G06T 17/005

OTHER PUBLICATIONS

Leake et al. (Procedures and Computer Programs for Telescopic mesh refinement using MODFLOW, (60 pages)). (Year: 1999).*

* cited by examiner

METHOD OF EXPLOITATION OF HYDROCARBONS OF AN UNDERGROUND FORMATION BY MEANS OF OPTIMIZED SCALING

CROSS-REFERENCE TO RELATED APPLICATIONS

Reference is made to French Patent Application no. 16/54.906, filed May 31, 2016, which is incorporated herein by reference in its entirety.

BACKGROUND OF THE INVENTION

Field of the Invention

The present invention relates to the exploration and exploitation of oil deposits and geological gas storage sites. The present invention more particularly concerns the determination of a meshed representation of categorical petrophysical properties of an underground formation containing hydrocarbons for defining optimum schemes for exploitation of the hydrocarbons contained in the formation.

Description of the Prior Art

The exploration and exploitation of a deposit, notably an oil deposit, necessitate the acquisition of as precise as possible knowledge of the underground geology in order to enable estimation of reserves, estimation of production or management of the exploitation of the deposit over time. In fact, determination of the location of a production well or an injection well in a hydrocarbon deposit, composition of the drilling sludge, completion characteristics, choice of a recovery process for hydrocarbons (such as water injection, for example) and parameters necessary for the execution of that method (such as the injection pressure, the production flow rate, etc.) necessitate a good knowledge of the deposit.

To acquire that knowledge, the oil industry combines measurements in the field (carried out in situ, during seismic campaigns, measurements in wells, core samples, etc.) with experimental modeling (carried out in the laboratory) and with digital simulations (carried out using software such as a flow simulator).

The formalization of this knowledge then entails establishing a geological model which accounts for, in an approximate manner, both the structure and the behavior of a deposit. This type of geological model is generally represented on a computer in the form of a meshed representation (which can be a regular grid or more generally a structured or non-structured meshing) with each of the meshes of the meshed representation including at least one value of one of the properties referred to above.

In order to represent the great variability of the land, the geological model generally has fine meshes, that is meshes with dimensions which are of the same order as the measurement step (which is generally the step of the seismic measurements). Although the capabilities of computers are improving with time, both in terms of storage capacity and in terms of computation capability, the dimensions of the zones of interest of the deposits being studied are increasing and the measurement steps are decreasing. Nowadays geological models have a very large number of meshes (of the order of around one hundred million meshes).

Now, when a meshed representation conforming to all of the data measured in the field is finally obtained, that representation is used to predict the movements of fluid in the formation under study and to plan its future development, via the determination of optimum exploitation schemes. To this end, selection of the zones of interest occurs (for example those having the highest levels of hydrocarbons) in which to drill new wells. The wells are placed precisely in the three spatial dimensions, and to verify if the production of hydrocarbons with that layout of the wells is the optimum, for example via a flow simulation.

To this end, and in particular to select the zones of interest and to place the wells in the three spatial dimensions, a visualization of the available information is enforced which contains in particular in the meshed representation of the formation under study. This visualization is generally viewed on a computer screen, using software enabling visualization of the sections in the various spatial directions, by for example, rotation of volumes, etc. The meshed representation of an underground formation having a very large number of meshes very often makes impossible visualization of this is possible, there is no operative interactivity.

Moreover, present day computing resources are not able to execute within a reasonable time scale a flow simulator such as the PumaFlow software (from IFP Energies nouvelles, France), on fine and detailed geological models. In fact, at present, the number of meshes generally used to simulate flows digitally is of the order of one hundred thousand.

Thus at present fine geological models are difficult to exploit, in particular on a computer, to view the definition of optimum exploitation schemes for an underground formation.

PRIOR ART

The following documents are cited in the description:

[1] Christie, M. A., and Blunt, M. J., "Tenth SPE Comparative Solution Project: A Comparison of Upscaling Techniques", SPE Reservoir Engineering and Evaluation, 4, 308-317, (2001).

[2] P. Cignoni, C. Montani, and R. Scopigno. A Comparison of Mesh Simplification Algorithms. Computers & Graphics, 22:37-54, 1997.

[3] Callahan Steven P., Comba Joao L. D., Shirley Peter, Silva Claudio T.: Interactive Rendering of Large Unstructured Grids Using Dynamic Level-of-Detail. Visualization, 2005. VIS 05. IEEE, 199-206.

In order to be able to exploit the information collected on a subterranean formation of interest, it is standard practice to construct meshed representations providing a coarser approximation of the reality than the fine mesh geological model.

If the target application is flow simulation, the known upscaling technique makes it possible to change from a fine mesh representation to a coarse mesh representation, also known as a reservoir model. The upscaling technique is described in document [1], for example. As a general rule, this technique calculates a coarse model that is the equivalent of the fine model from the point of view of dynamic properties, that is properties linked to the flow of fluids, such as permeability. The foundation of upscaling is therefore the homogenization of the dynamic properties of the formation. The simplest homogenization technique is, for each of the meshes of the coarse representation, to average the values of the dynamic properties in the group of meshes of the geological model corresponding to the coarse mesh. In the case of a categorical property such as lithology, each value of the property defines a given class (for example, the value 10 is allocated to the meshes of the representation containing limestone, the value 20 to meshes containing clay, and the value 50 to meshes containing sands). Averaging, or more generally homogenization, is in fact meaningless in the case of categorical properties. In this case, it is standard practice to allocate to the coarse mesh the value of the predominant property in the corresponding group of meshes, possibly weighted by the volume of rock or the porous volume. The upscaling step can use the CobraFlow software (from IFP Energies nouvelles, France), for example.

Where visualization of meshed representations is concerned, if a digital model reaches a size and a precision that no longer enables display of all the information on a computer screen, techniques termed "level of detail" techniques are routinely called upon that simplify the model in order to be able to display information that the user can interpret visually in particular documents [2] and [3]. Level of detail techniques employd for simplification of the digital model introduces a loss of precision. A decimation operation is generally applied to the meshing in order to reduce the number of geometrical elements displayed on the screen. This decimation will depend on the angle of view (the angle at which the volume is visualized) and the observed zone. The operators used for decimation (contraction of edges, merging of apexes, merging of faces in particular), even if they rely on an error metric minimizing deformations, introduce a loss of precision and possibly of artifacts in the zones of discontinuity.

In all cases, whether it is for upscaling (for example with a view to a reservoir simulation) or for visualization (with a view to laying out wells, for example) of a meshed representation, the methods for changing from a fine mesh representation to a coarser mesh representation are not designed to be reversible, which makes it necessary to retain the meshed representations determined at all scales. Moreover, for the exploitation of the oil in an underground formation potentially lasting several decades, it may be necessary to determine a plurality of meshed representations of the same formation to different scales but also at different times during the exploitation of the formation. In this case it is therefore necessary to store large volumes of information for the exploitation of the same underground formation over time.

SUMMARY OF THE INVENTION

The present invention is a method for changing from a fine mesh representation to at least one other coarser mesh representation (referred to as of lower resolution hereinafter) when the property under study is a categorical property, at the same time as storing resolution change parameters, which enable exact reconstitution of the initial fine mesh representation. Moreover, the retention of these change parameters can require less memory resources than the retention of the directly higher resolution meshed representation.

The present invention is a method of exploiting an underground formation containing hydrocarbons on a basis of measurements of at least one categorical property relating to the formation, in which a first meshed representation of the formation is constructed, with each mesh of the first representation including a value of the categorical property, and in which, on a basis of the first meshed representation, at least one second meshed representation of the formation is constructed, the resolution of the second representation being lower than the resolution of the first representation, with a result being that a mesh of the second representation corresponds to a group of meshes of the first representation. For each of the meshes of the second representation and for the property the method executes at least steps of:

A. determining a value representative of values of the property in the meshes of the group of meshes of the first representation corresponding to the mesh of the second representation and assigning the representative value to the mesh of the second representation;

B. determining parameters for changing from the second representation to the first representation by a linear combination applied between the value assigned to the mesh of the second representation and the values of the property in the meshes of the group of meshes of the first representation corresponding to the mesh of the second representation.

Then, by use of at least the second representation, the parameters for changing and the linear combination, at least one optimum exploitation scheme of the hydrocarbons of the formation is determined and the formation is exploited as a function of the exploitation scheme.

According to one embodiment of the invention, the determination of the exploitation scheme may include an iterative determination of a series of N meshed representations $R_n$ with resolutions that are lower than the resolution of the first representation $R_1$, with n varying between 3 and N, and determination of the $n^{th}$ representation $R_n$ being produced by use of at least steps of:

i reconstituted the first representation $R_1$ by use of the representation $R_{n-1}$, the parameters for changing and the linear combination determined in iteration n−1; and ii steps A and B are applied on a basis of the reconstituted first representation $R_1$ and for the $n^{th}$ representation $R_n$.

At least one of the meshed representations having a resolution lower than resolution of the first representation is determined in at least one zone of interest of the formation including a zone along a well, a zone along a horizon, or a zone along a fault.

According to one embodiment of the invention, the at least one representative value may correspond to the value of the property having the highest occurrence and a greatest correlation length in the group of meshes of the first representation.

The linear combination may preferably be in a subtraction.

According to one embodiment of the invention, the steps A and B may be repeated for each of the categorical properties relating to the formation.

According to one embodiment of the invention, an optimum exploitation scheme may be determined by use of at least one visualization of the meshed representations having different resolutions and/or by use of flow simulations executed on the meshed representations having different resolutions.

According to one embodiment of the invention, the categorical property may correspond to a lithology, a relative permeability after classification, a fluid pressure after classification or an oil saturation after classification.

The invention further concerns a computer program product downloadable from a communication network and/or stored on a computer-readable medium and/or adapted to be executed by a processor, including program code instructions for executing the method described above when the program is executed on a computer.

Other features and advantages of the method according to the invention will become apparent on reading the following description of nonlimiting embodiments with reference to the appended figures described hereinafter.

DETAILED DESCRIPTION OF THE INVENTION

The following definitions are used in the description of the invention:

A categorical property: is a finite set of symbolic values represented by categories as for example categories C0, C1, C2, etc. One example of a categorical property is lithology, for which the various categories correspond to the various types of rock (for example sandstone, sand, limestone, clay, etc.). A categorical property can also be obtained after applying a classification to a given property. Classification is a method which is well known which groups points by family with the points of the same family having common characteristics. A classification can be applied to a given petrophysical property of the formation under study but it is more generally applied to an attribute of the formation under study. An attribute is the result for example of a linear combination applied to at least one petrophysical property. The classification may employ a classification method, for example, such as the well-known K-means method. It is therefore standard practice in the field of the exploitation of an underground formation to use classification to determine the zones of the formation under study having similar characteristics (for example in terms of height of oil and/or gas, relative permeability to oil and/or gas and/or water, horizontal permeability, fluid pressure, oil and/or gas and/or water saturation). If categorical properties have to be processed on a computer, by digital simulation software (for example a flow simulation) or for visualization purposes, these properties are represented by integers.

Resolution of a meshed representation is a measure of how fine the details of a meshed representation are that are linked directly to the physical dimensions of the meshes in all spatial directions. Thus a meshed representation has a resolution lower than that of another meshed representation if at least one of these dimensions of its meshes in at least one spatial direction is greater. When the ratio between the dimensions of the meshed representations having different resolutions is an integer, a mesh of the lower resolution meshed representation corresponds to (that is combines or contains) a group of meshes of the meshed representation with the higher resolution (possibly with the exception of edge effects).

Generally speaking, the invention concerns a method for exploitation of an underground formation containing hydrocarbons notably including the determination of at least one optimum exploitation scheme for the hydrocarbons of the formation.

The invention more particularly concerns, on the basis of a meshed representation of an underground formation, with each mesh of the first representation including a value of at least one categorical property, the construction of at least one second meshed representation of the formation which is being studied is characterized by mesh dimensions greater (in at least one spatial direction, and preferably at least in the two lateral spatial directions) than those of the first meshed representation, and includes a value of the categorical property that is concerned. According to the invention, the second meshed representation, of lower resolution, is then advantageously used for the determination of an optimum exploitation scheme of the fluid contained in the underground formation under study.

For the purposes of the method according to the invention, the categorical property concerned is represented by discrete integer values, preferably consecutive integer values.

The following non-limiting description of the present invention applies to three-dimensional meshed representations but the method according to the invention is applicable to meshed representations with any number of dimensions.

The present invention requires the availability of at least:

Measurements of at least one categorical property relating to the formation in which measurements are carried out in situ (for example by means of core samples, via outcrop studies, via diagraphs produced in wells, by seismic acquisition campaigns, etc.), at different points of the formation under study. From these measurements it is possible to determine a value of the categorical property under study (that is more generally, the category or the class of the property concerned, to which this measurement belongs) for each of the measurement points concerned. When the categorical property being studied is lithology, it is possible for example to exploit directly core samples taken on site in order to deduce therefrom the lithology present at the point from which the core sample was taken, to produce and to interpret gamma-ray diagraphs coupled to density diagraphs, for example, in order to deduce therefrom the lithology along the wells into which the diagraphy tools are inserted, to carry out a seismic acquisition campaign and to exploit this data, for example via a stratigraphic inversion in order physically to extrapolate the information between wells and to determine the limits of the geological layers materially representing changes of lithology. These measurements are notably used to construct a first (fine mesh) meshed representation of the formation under study. Measurements may advantageously also be carried out to provide access to information on the non-categorical petrophysical properties of the formation under study (such as permeability, fluid saturations, etc.), or it is possible to exploit production data (such as flow rates of oil, of water, pressure variations, etc.) to construct a meshed representation that could be used for flow simulation;

A first meshed representation of the formation under study is a first geological model of the underground formation under study, which is generally represented on a computer in the form of a meshing or grid. Each of the meshes of this grid contains one or more values of properties relating to the formation under study (here at least one categorical property such as lithology). When the invention is used, this first meshed representation most often corresponds to the constructed geological model in order to describe as accurately as possible the structure and the properties (here at least one categorical property such as lithology) of the formation under study. A geological model has to verify as much as possible the properties relating to the formation under study collected in the field which are diagraphy data measured along wells, measurements carried out on rock samples taken in wells, data deduced from seismic acquisition campaigns, or production data such as flow rates of oil, water, pressure variations, etc. The geological model generally has fine meshes (in theory the dimensions of the meshes depend on the resolution of the seismic data which nowadays can be of the order of 5 m laterally and vertically), and consequently a large number of meshes. Those who perform oil exploration are fully aware of techniques for constructing this kind of meshed representation of a formation.

The present invention includes at least the following steps:
1. Construction of a second meshed representation
    1.1. Determination of a representative categorical property value
    1.2. Determination of change parameters
2. Determination of an optimum exploitation scheme
3. Exploitation of the formation The main steps of the present invention are described in detail hereinafter.

1. Construction of a Second Meshed Representation

It is a question during this step, on the basis of the first meshed representation of the formation being studied, of constructing a second meshed representation of the formation with each mesh of the second representation corresponding to a group of meshes of the first representation. In other words, there is constructed, on the basis of a first meshed representation (which can correspond to the fine mesh geological model or to any meshed representation with any resolution) a second representation of the formation under study characterized by meshes with larger dimensions. A mesh of the second representation contains a group of meshes of the first representation (i.e. at least two meshes, possibly with the exception of the edges when one of the dimensions of the meshes of the second representation does not correspond to a multiple of the equivalent dimension of the meshes of the first representation). The objective of this step is therefore to construct a (second) meshed representation of lower resolution than the (first) meshed representation at the start of the step.

According to one embodiment, each mesh of the second meshed representation (with the exception of the edge meshes) includes an identical number of meshes for all the dimensions being considered. For example, a mesh of the second representation may comprise 8, 27, 64, 125, etc. meshes of the first representation.

Hereinafter, and to simplify the description of the invention, the second meshed representation is referred to as the "coarse grid" and the first meshed representation as the "fine grid". Also (DFi, DFj, DFk) denote the dimensions in the three spatial directions (i,j,k) of the meshes of the fine grid and (DGi, DGj, DGk) the dimensions in the three spatial directions (i,j,k) of the meshes of the coarse grid, with at least one of the ratios $$\frac{DGi}{DFi}, \frac{DGj}{DFj}, \frac{DGk}{DFk}$$

being greater than or equal to 2. The dimensions can be expressed as a number of meshes relative to a reference or as physical dimensions. The dimensions of the meshes of the coarse grid are determined, for example by flow simulation to determine these dimensions as a function of the computation capabilities of the computer on which the flow simulation is executed. For example, a mesh dimension of the coarse grid in a given spatial direction which is equal to a multiple of the dimension in that same direction of the meshes of the fine grid can be determined.

The method according to the invention includes two sub-steps that are to be applied for each categorical property under consideration and for each of the meshes of the coarse grid. These sub-steps are described in detail hereinafter.

1.1 Determination of a Representative Categorical Property Value

During this sub-step it is a question of assigning a representative categorical property value to the mesh of the coarse grid under consideration. According to the invention, this value corresponds to a representative value of all of the categorical property values contained in the meshes of the group of meshes of the fine grid corresponding to the mesh of the coarse grid under consideration.

According to one embodiment of the invention, the representative value to be assigned to the mesh of the coarse grid corresponds to the value of the categorical property under consideration that has the highest occurrence in the group of meshes of the corresponding fine grid. According to another embodiment of the invention, the representative value to be assigned to the mesh of the coarse grid may be determined as being the value of the categorical property having the greatest correlation length in the group of meshes of the corresponding fine grid (which means that the preference is for the repetition of a given categorical property value from one mesh to a directly adjacent mesh in a group of meshes of the fine grid).

According to a variant embodiment of the method according to the invention, the representative value is determined as given the value of the categorical property concerned having the highest occurrence and the greatest correlation length in the group of meshes of the corresponding fine grid. According to another variant embodiment of the method according to the invention, and when the categorical property under study is lithology, for example, there can also be taken into account the ratio between the volume of rock and the porous volume. These variants enable a non-arbitrary choice to be made when a plurality of categorical property values would have the same occurrence and/or the same correlation length.

Hereinafter the term "mode" refers to the representative categorical property value of a group of meshes of the fine grid concerned. According to the invention, this mode is assigned in the mesh of the coarse grid corresponding to the group of meshes of the fine grid under consideration.

According to one embodiment of the invention, the position of this mode in the group of meshes under consideration is stored in addition to the representative value of a group of meshes of the fine grid under consideration. It can be stored in a table, for example a computer table. If (i,j,k) denotes the position of the mesh of the fine grid identified in this way, the position of the mode can advantageously be stored in linear form, for example in accordance with a formula of the type: $DG'i=DG'j*k+DG'i*j+1$, where $DG'i, DG'j$ are the dimensions of the coarse grid in the spatial directions (i,j) expressed as a number of meshes relative to the fine grid. This representation of the position enables the information to be stored in a one-dimensional table containing only one integer, which is advantageous in terms of memory size, notably computer memory size.

1.2 Determination of Change Parameters

During this sub-step it is a question of determining change parameters for the change from the coarse grid to the fine grid, with the change parameters enabling reconstruction of the fine grid from the coarse grid. According to the invention, the determination of these change parameters is based on the application of a linear combination as a function of the value assigned to the mesh of the coarse grid (that is the representative value determined in the preceding sub-step or mode) and the values in the meshes of the group of meshes of the fine grid corresponding to the mesh of the coarse grid being considered. According to one embodiment of the invention, the linear combination may comprise at least one arithmetic operation (addition, subtraction, etc.) applied between the value assigned to the mesh of the coarse grid and the values in the meshes of the group of meshes of the corresponding fine grid, weighted by any constant, together with the addition of any constant to the result of this arithmetic operation. For example, if XG denotes the value assigned to the mesh of the coarse grid and XF denotes the value in one of the meshes of the group of meshes of the fine grid corresponding to the coarse grid concerned, the change parameters P can be evaluated in accordance with a formula of the type: $P=aXF \cdot OA \cdot XG+b$, where OA is an arithmetic operation applied between XG and XF and a and b are constants. According to the invention, the result of this linear combination is stored, for example in a computer table. On the basis of the result of this linear combination for each of the meshes of the fine grid corresponding to the mesh of the coarse grid being considered, it is possible to retrieve, by applying the "inverse" of the linear combination (in particular by inverting the arithmetic operations of the linear combination), each of the values of the fine grid as initially filled in. For example, on the basis of the change parameters P and the values of the coarse grid XG as defined above, it is possible to retrieve the values of the fine grid by application of the inverse arithmetic operation $OA^{-1}$ in accordance with a formula of the type:

$$XF = \frac{(P-b)}{a} \cdot OA^{-1} \cdot XG.$$

In this way, the determination of a meshed representation of lower resolution being reversible, it is not necessary to retain the initial meshed representation, which is very advantageous in terms of storage memory space.

According to one embodiment of the invention the linear combination in question is a subtraction (and its inverse is then an addition), applied between the value assigned to the mesh of the coarse grid and the values in the meshes of the group of meshes of the corresponding fine grid. To be more precise, it is a question of obtaining, for each group of meshes, the difference between the value of the categorical property in each of the meshes of the group of meshes under consideration and the representative value assigned to the mesh of the coarse grid corresponding to the group of meshes under consideration. According to the invention, the result of obtaining these differences is stored, for example in a computer table. Whichever mesh of the group of meshes being considered, this refers to a value of the difference that is necessarily less than the value of the initial categorical property, or even zero if the value in the mesh of the group of meshes being considered was equal to the representative value (or mode) being determined during the preceding sub-step. When the differences are stored on computer, it follows that the number of bytes (groups of 8 bits coding information) for storing them is less than the number of bytes necessary for storing the initial values, before the difference is obtained. Consequently, the computer table in which the differences are stored is smaller in terms of memory size than that storing the initial values. Given the number of meshes, which can be of the order of several tens of millions in the fine mesh, this can represent tens of Gigabytes of memory freed up. Moreover, since the resulting computer file is smaller, this enables a much shorter file transfer time, which is particularly advantageous and is desirable when multiple access to the computer files is required during digital simulations carried out on a supercomputer, for example.

According to one embodiment of the invention in which there has been determined, during the sub-step 1.1, a mode for the group of meshes being considered and moreover the position of that mode, the linear combination described above may be carried out and the result stored only for the meshes of the group of meshes being considered, to the exclusion of that corresponding to the mode which applies for each mode. In fact, the value of the mode and its position being stored, it is known how to replace it in the initial meshed representation.

According to another embodiment of the invention, step 1 is repeated for the various categorical properties available concerning the formation under study, for example categorical properties bearing on the quantity of hydrocarbons, the nature of those hydrocarbons, the pressure in the mesh under study, etc. According to one embodiment of the invention, this can be done at different times in the exploitation of an underground formation, information on a given categorical property, or information on a new categorical property, not yet taken into account in the method according to the invention, possibly being accessible at any time during the exploitation of the underground formation under study.

2—Determination of an Optimum Exploitation Scheme of the Formation

During this step it is a question of defining, on the basis of at least the second meshed representation, the associated change parameters and the linear combination determined in the preceding step, at least one optimum exploitation scheme for the fluid contained in the formation, that is an exploitation scheme enabling optimum exploitation of the fluid in question in accordance with technical and economical criteria which are predefined.

The definition of an exploitation scheme for the fluid from the formation under study may result in choosing a type of recovery method (for example a recovery method by injection of water), and then determining, for that type of method, the number, geometry and layout (position and spacing) of the injection and production wells encouraging the movement of the fluids within the reservoir. Generally different production scenarios (number, layout and geometry of the injection and/or production wells) are generated and estimates of the recovery rate for each of those scenarios, for example using a flow simulator are provided such as by using the PumaFlow software (from IFP Energies nouvelles, France). The exploitation scheme offering the best fluid recovery rate at lowest cost is preferred, for example.

The determination of an optimum operating scheme most often includes a step of visualization, for example on a computer screen, of the information available on the formation under study, which includes the visualization of the categorical information. For example, on the basis of a visualization of the zones including the most hydrocarbons or overpressure zones, the zone or zones of the formation under study can be determined in which a well is most appropriate, together with the spatial geometry of that well. In practice, the visualization of this information is most often multi-resolution, that is affected with different levels of resolution, in particular to gradually specify the zones of interest and/or the positioning the required wells.

Moreover, the determination of an optimum exploitation scheme generally involves repeated flow simulations, notably to test different scenarios for positioning wells, for the recovery process, etc. According to one embodiment of the invention, the flow simulation tests can be carried out on a series of degraded grids of the initial fine grid That is a series of grids with different resolutions all less than that of the initial fine grid are utilized. For example, it can initially be decided to carry out tests on a grid in which the dimensions of the meshes are ten times those of the fine grid. Then as a function of the consistency of the results obtained with the reintroduction data, a new test is carried out with mesh dimensions five times those of the fine grid, and so on.

Thus according to an embodiment of the invention, in particular for multi-resolution visualization and/or multi-resolution flow tests, there is determined a series of N meshed representations $R_n$ representative of the formation, in which each representation has a resolution lower than the resolution of the initial fine representation $R_1$. Each representation preferably has its own resolution, that is the resolutions of the $R_n$ representations are different from one another. For example, at least one of the dimensions of the meshes is different from one representation to another. With n varying between 1 and N, the representations $R_1$ and $R_2$ of this series respectively correspond to the first and second representations determined beforehand in step 1 as described above. The $n^{th}$ representation $R_n$, with n varying between 3 and N, is determined in accordance with at least the following steps:
  i the first representation $R_1$ is reconstituted by use of the representation $R_{n-1}$ of the change parameters and the linear combination determined in iteration n−1; and
  ii the steps A and B are applied on the basis of the reconstituted first representation $R_1$ and for the $n^{th}$ representation $R_n$.

Accordingly, with the method according to the invention, it is not necessary to retain the meshed representations for each of the resolutions because it suffices to retain a single meshed representation, with a given resolution, and its associated change parameters, so as to reconstitute the initial meshed representation and then to determine meshed representations of lower resolution. In order to reduce storage in memory, after a given iteration n, there are preferably deleted from the computer the change parameters and the meshed representation determined in the iteration n−1, together with the reconstituted initial meshed representation.

According to an embodiment of the invention involving at least one multi-resolution visualization of meshed representations, the series of N meshed representations may be determined "on the fly", that is as visualization proceeds, for example on a computer screen.

According to an embodiment of the invention involving at least one multi-resolution visualization of meshed representations, the method according to the invention may be executed only for (at least) one portion of a meshed representation of an underground formation, for example of a zone of interest of the formation under study, such as along a well, a horizon, or a fault. It is therefore possible to calculate only portions of one (or more) meshed representation(s) with lower resolution(s) in zones of interest. This embodiment can be particularly advantageous in the phase of positioning a well (which must be done extremely precisely), for example, as it makes it possible to reduce the computation times and therefore to improve the interactivity of the visualization. The first detailed meshed representation for the whole of the formation is advantageously stored and the method according to the invention applied to a portion of the initial meshed representation.

According to one embodiment of the invention the dimensions of the meshes of the meshed representation in an iteration n (with n varying between 3 and N) are doubled relative to the dimensions of the meshes of the meshed representation determined in the preceding iteration n−1.

According to one embodiment of the invention involving at least one multi-resolution visualization of meshed representations, in order to meet requirements for interactive visualization, intermediate meshed representations (for example one every three iterations) and their associated change parameters are advantageously stored.

By making it necessary to retain only one grid with any resolution and its associated change parameters, the present invention therefore makes possible a very large saving in memory space, which is very advantageous throughout the exploitation of an underground formation.

3—Exploitation of the Formation

According to the invention, the fluid (the hydrocarbons) of the formation under study is then exploited as a function of at least one of the optimum exploitation schemes determined in the preceding step. Therefore, the fluid of the formation in accordance with the scenario defined in the preceding step can be established making it possible to optimize the production of that fluid, notably by drilling at least one production well with the number and/or layout of which wells were determined in the preceding step, to extract the hydrocarbons from the formation under study.

Computer Program Product

The invention further concerns a computer program product downloaded from a communication network and/or stored on a computer-readable medium and/or executable by a processor and including program code instructions for the execution of the method as described above when the program is executed on a computer.

APPLICATION EXAMPLES

The features and advantages of the method according to the invention will become more clearly apparent on reading the following application examples.

Example 1

The first example described hereinafter is a purely illustrative example of the various steps of the method according to the invention and its variants.

For this example, the first meshed representation or fine grid is constituted of 6×4×4 meshes containing a categorical value. The method according to the invention is applied so as to determine a coarse grid of 3×2×2 meshes. In other words, each mesh of the coarse grid corresponds to a group of 2×2×2 meshes of the fine grid.

This embodiment of the invention is executed in the following manner:
  in order to determine the representative value or mode of each group of meshes of the fine grid corresponding to a mesh of the coarse grid there is used the criterion defined in the sub-step 1.1, based on the categorical property having the highest occurrence combined with the greatest correlation length;
  the linear combination considered for the application of the sub-step 1.2 is a subtraction;

there is stored in a table T1 the position of the mode determined for each group of meshes, in linear position form as defined in the sub-step 1.2;

there are stored in one and the same table T2 both the representative values or modes (cf sub-step 1.1) and the change parameters (cf sub-step 1.2) These change parameters not evaluated for the meshes of the fine grid corresponding to the positions of the modes (cf sub-step 1.2).

Figure 1A:
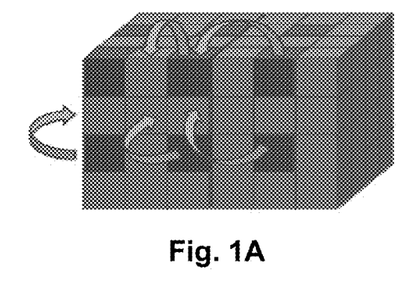
FIGS. 1A and 1B are diagrams showing one embodiment of the method according to the invention for a first meshed representation comprising 6×4×4 meshes.
Figure 1B:
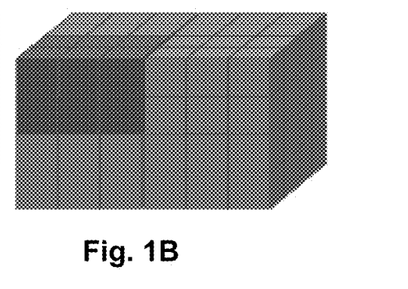

To be more precise, in this example the method according to the invention is executed in the following manner:

each group of meshes of the fine grid is considered with each group containing 8 integer values in a range denoted [Vmin, Vmax] and a mode is determined for each group as well as its position (i, j, k) in the latter. If a plurality of values have the same occurrence, the mode stored corresponds to the value that has the highest occurrence in a vicinity around the current group;

then, for each group of meshes:

the value found in the mesh (i, j, k) is placed in the position (1, 1, 1) of each group, as shown in FIG. 1A in which the modes of each group of meshes of dimension 3×2×2 are identified by the dark grey cubes;

the values at the positions (i', j', k')≠(1, 1, 1) in a group are updated by subtracting the mode, as follows:

$$V((i',j',k')\neq(1,1,1))=V((i',j',k')\neq(1,1,1))-V(1,1,1);$$

the position (i, j, k) of the mode in the group is stored independently as linear coordinates in a table T1;

when all of the groups have been processed, the modes V (1, 1, 1) are grouped as shown by the arrows in FIG. 1A. The result of this grouping is shown in FIG. 1B. This step, which is referred to as decomposition hereinafter, can be executed by an algorithm of the following type:

---

For x' from 1 to DFi in steps of 2
  For y' from 1 to DFj in steps of 2
    For z' from 1 to DFk in steps of 2
$$T2(x', y', z') \leftrightarrow T2\left(\frac{1+x'}{2}, \frac{1+y'}{2}, \frac{1+z'}{2}\right)$$
    End For
  End For
End For

---

As shown in FIG. 1B, there are obtained in the upper left-hand part of the three-dimensional table T2 all of the modes determined in this way (the group of meshes in dark grey in FIG. 1B), this part of the table corresponding to the meshed representation of lower resolution determined by the method according to the invention. The remainder of this table (the meshes in light grey in FIG. 1B) contain the change parameters of the method according to the invention, making it possible to reconstitute the initial meshed representation from the representation of lower resolution.

Example 2

Figure 2A:
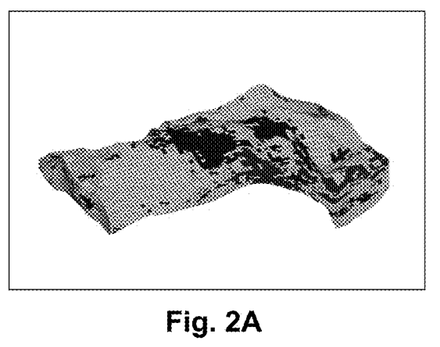
FIG. 2A shows an example of a geological model for the application of the method according to the invention with FIGS. 2B, 2C and 2D show meshed representations of decreasing resolution obtained by application of the method according to the invention.
Figure 2B:
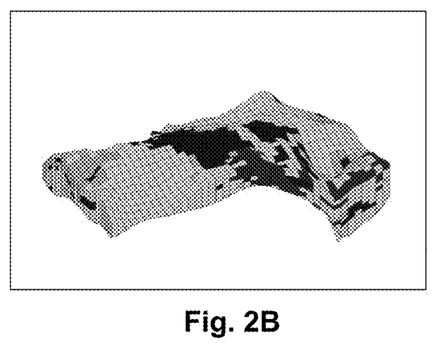
Figure 2C:
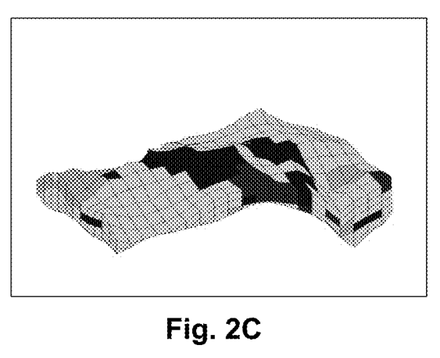
Figure 2D:
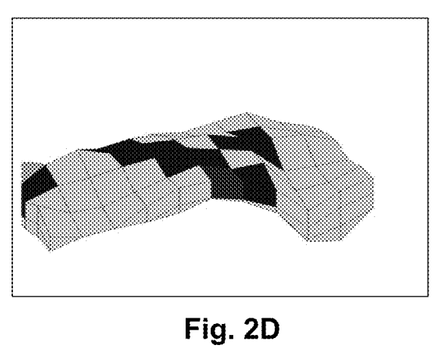

A second application example concerns the use of the method according to the invention on a fine mesh geological model of an underground formation comprising approximately one million meshes. The meshed representation of this geological model, denoted R1 hereinafter, is shown in FIG. 2A. FIGS. 2B, 2C and 2D correspond to respective meshed representations R2, R3, and R4 of increasingly low resolution compared to the initial meshed representation R1. The dimension of the meshes of the meshed representations are multiplied by two in each spatial direction between the representation R1 and the representation R2, between the representation R2 and the representation R3, and between the representation R3 and the representation R4. The meshed representation R4 therefore contains only approximately 2000 meshes. Moreover, each of the meshes of the meshed representations shown in FIGS. 2A, 2B, 2C, and 2D includes a categorical property value represented by a shade of grey (the color scales are identical from one figure to another).

The criterion for determining the representative value (or mode) of the categorical property concerned for each group of meshes of dimension 2×2×2 of a given meshed representation is that with the highest occurrence combined with the maximum correlation length (cf sub-step 1.1) in the group concerned. This criterion appears particularly suitable since there can be seen a consistent localization of the values of the categorical property from one resolution to another (FIGS. 2A, 2B, 2C, and 2D).

Example 3

A third application example concerns the application of the method according to the invention to a geological model of an underground formation represented by an initial meshed representation R1 of dimension 1000×1000×1000 (i.e. 1 billion meshes). On the basis of this meshed representation, there are determined by the method according to the invention three other representations, respectively denoted R2, R3, and R4, of increasingly lower resolution. The dimension of the meshes of the meshed representations are multiplied by two in each spatial direction between the representation R1 and the representation R2, between the representation R2 and the representation R3, and between the representation R3 and the representation R4. The memory size of the multi-resolution representations starting from the original representation R1 is therefore de facto divided by 8 on each change to a coarser resolution $R_{n+1}$, with n between 1 and 3, as shown in the first line of Table 1.

The change parameters of the method according to the invention have moreover been determined by a subtraction applied between mode and categorical property values in each of the meshes of a group (cf. sub-step 1.2), and this applies to each group of meshes. The second line of Table 1 specifies the memory size required to store the change parameters making it possible to change from a given meshed representation to a representation of directly higher resolution (i.e. from R4 to R3, from R3 to R2 and from R2 to R1). This example shows clearly the saving in memory size obtained by the method according to the invention since the overall memory size for a given resolution (sum of the memory size for the meshed representations and the memory size for the change parameters of a given resolution) is equal to the memory size of the single meshed representation (i.e. with no change parameters) of the higher resolution.

TABLE 1

|  | R1 | R2 | R3 | R4 |
|---|---|---|---|---|
| Memory size of the meshed representations (Mb) | 4000 | 500 | 70 | 8 |
| Memory size of the change parameters (Mb) | 0 | 3500 | 430 | 62 |

The method according to the invention therefore makes it possible, on the basis of a first meshed representation in which each mesh includes at least one categorical property value, to determine at least one meshed representation of lower resolution the categorical property values which are consistent with those of the representation of directly higher resolution. Moreover, with the method according to the invention, determination of change parameters for reconstituting the meshed representation of the higher resolution uses the meshed representation of lower resolution and a linear combination. It is no longer necessary to store the meshed representation of higher resolution. When the linear combination in question is a subtraction, these change parameters, when stored in a computer table, have a smaller memory size than the memory size of the higher resolution meshed representation, which is particularly advantageous in terms of information storage, but also in terms of information transfer speed.

The invention claimed is:

1. A method for exploiting an underground formation containing hydrocarbons based on measurements of at least one categorical property relating to the formation, values of the categorical property being represented by an integer, in which a fine first meshed representation of the formation is constructed, with each mesh of the fine first meshed representation including an integer value of the at least one categorical property, and based on the fine first meshed representation, constructing at least one second coarse meshed representation of the formation with resolution of the at least one second coarse meshed representation being lower than the resolution of the first fine meshed representation, so that each mesh of the at least one coarse second meshed representation corresponds to a group of meshes of the first fine meshed representation, and for each of the coarse meshes of the at least one second coarse meshed representation and for the at least one categorical property, executing steps comprising:

A. determining an integer value for the at least one categorical property for the coarse mesh of the second coarse meshed representation which represents integer values of the at least one categorical property of the group of fine meshes of the first fine meshed representation corresponding to the coarse mesh of the at least one second coarse representation; and B. determining change parameters for an exact reconstitution of the first fine meshed representation from the at least one second coarse meshed representation by applying a linear combination which is a subtraction between the integer value determined for the mesh of the at least one second coarse representation and the integer values of the categorical property of the meshes of the first fine meshed representation corresponding to the coarse mesh of the at least one second representation;

using the at least one second coarse meshed representation, the determined change parameters of each mesh of the at least one second coarse meshed representation and the linear combination to determine an exploitation scheme; and exploiting the hydrocarbon of the formation with the exploitation scheme.

2. A method according to claim 1, in which the determination of the exploitation scheme includes iterative determination of a series of N meshed representations $R_n$ with resolutions lower than a resolution of the first representation $R_1$, with n varying between 3 and N, in which determination of the $n^{th}$ representation of $R_n$ is produced by steps of:

i. reconstituting the first representation $R_1$ by use of a representation $R_{n-1}$ determined for an iteration n−1 and a change of parameters and the linear combination determined in the iteration n−1; and ii. steps A and B are applied based on a reconstituted first representation $R_1$ and for an $n^{th}$ representation $R_n$.

3. A method according to claim 1, wherein at least one of the second meshed representations is determined in at least one zone of interest of the formation and the formation is one of a zone along a well, a zone along a horizon, or a zone along a fault.

4. A method according to claim 2, wherein at least one of the second meshed representations is determined and the formation is one of a zone along a well, a zone along a horizon, or a zone along a fault.

5. A method according to claim 1, wherein the value determined for the at least one categorical property for the mesh of the second meshed representation corresponds to the at least one categorical property having at least a highest occurrence and a greatest correlation length in corresponding meshes of the first representation.

6. A method according to claim 2, wherein the value determined for the at least one categorical property for the mesh of the second meshed representation corresponds to the at least one categorical property having at least a highest occurrence and a greatest correlation length in corresponding meshes of the first representation.

7. A method according to claim 3, wherein the value determined for the at least one categorical property for the mesh of the second meshed representation corresponds to the at least one categorical property having at least a highest occurrence and a greatest correlation length in corresponding meshes of the first representation.

8. A method according to claim 4, wherein the value determined for the at least one categorical property for the mesh of the second meshed representation corresponds to the at least one categorical property having at least a highest occurrence and a greatest correlation length in corresponding meshes of the first representation.

9. A method according to claim 1, wherein the steps A and B are repeated for each categorical property relating to the formation.

10. A method according to claim 2, wherein the steps A and B are repeated for each categorical property relating to the formation.

11. A method according to claim 3, wherein the steps A and B are repeated for each categorical property relating to the formation.

12. A method according to claim 1, wherein the exploitation scheme is determined by use of at least one of visualization of the meshed representations having different resolutions and flow simulations executed on meshed representations having different resolutions.

13. A method according to claim 1, wherein the property is a categorical property corresponding to lithology, relative permeability after classification, fluid pressure after classification or oil saturation after classification.

14. A computer program product comprising a non-transitory computer-readable medium storing a computer program which is executed by a processor to perform the method according to claim 1.

* * * * *